United States Patent [19]
Steiling et al.

[11] Patent Number: 5,969,519
[45] Date of Patent: Oct. 19, 1999

[54] MAGNETIC SENSOR DEVICE FOR THE DETECTION OF THE POSITION OF A MOTOR VEHICLE PART

[75] Inventors: Rainer Steiling, Lüdenscheid; Stefan Garneyer, Hagen; Kersten Rimke, Herscheid, all of Germany

[73] Assignee: Leopold Kostal GmbH & Co. KG, Ludenscheid, Germany

[21] Appl. No.: 08/784,424

[22] Filed: Jan. 16, 1997

[30] Foreign Application Priority Data

Jan. 30, 1996 [DE] Germany ............................ 196 03 197

[51] Int. Cl.⁶ ............................. G01B 7/14; H01H 36/00; B60N 41/00; H01L 43/06
[52] U.S. Cl. .................... 324/207.2; 324/207.24; 341/15; 74/335
[58] Field of Search ............................ 324/207.2, 207.21, 324/207.24; 341/15; 74/335, 473.1, 473.12, 473.3, 473.31, 473.36

[56] References Cited

U.S. PATENT DOCUMENTS 3,768,094  10/1973  Henrich ...................................... 341/15
5,307,013  4/1994  Santos et al. ....................... 324/207.24
5,370,015  12/1994  Moscatelli ............................ 324/207.2

FOREIGN PATENT DOCUMENTS

4123480A1  1/1993  Germany .

Primary Examiner—Walter E. Snow
Attorney, Agent, or Firm—Brooks & Kushman P.C.

[57] ABSTRACT

An electrical signal transmitter intended for use in a motor vehicle is disclosed. The signal transmitter is provided with a magnetic sensor device for the detection of various positions of a movable vehicle part. To properly recognize a variety of positions, the movable part is connected with a correspondingly movable magnetic trigger member located on a holder. The trigger member has several magnetic tracks extending in the longitudinal direction of movement of the trigger member. Each magnetic track is provided with alternating N/S pole sections to provide a coding scheme. At least one magnetic field sensitive component is associated with each magnetic track to sense fields generated from the N/S pole sections. The at least one magnetic field sensitive component then generates a signal based on the sensed magnetic fields. The signal is indicative of the position of the magnetic trigger. The magnetic field sensitive components are operable with a switching arrangement which evaluates the signal to influence a device associated with the movable part.

8 Claims, 2 Drawing Sheets

| Position | Bit A | Bit B | Bit C | Bit D |
|---|---|---|---|---|
| 0 | 0 | 0 | 0 | 0 |
| 1 | 0 | 0 | 0 | 1 |
| 2 | 0 | 0 | 1 | 1 |
| 3 | 0 | 0 | 1 | 0 |
| 4 | 0 | 1 | 1 | 0 |
| 5 | 0 | 1 | 1 | 1 |
| 6 | 0 | 1 | 0 | 1 |
| 7 | 0 | 1 | 0 | 0 |
| 8 | 1 | 1 | 0 | 0 |
| 9 | 1 | 1 | 0 | 1 |
| 10 | 1 | 1 | 1 | 1 |
| 11 | 1 | 1 | 1 | 0 |
| 12 | 1 | 0 | 1 | 0 |
| 13 | 1 | 0 | 1 | 1 |
| 14 | 1 | 0 | 0 | 1 |
| 15 | 1 | 0 | 0 | 0 | ically to the position of a movable part of a
MAGNETIC SENSOR DEVICE FOR THE DETECTION OF THE POSITION OF A MOTOR VEHICLE PART

TECHNICAL FIELD

The present invention relates to motor vehicle electrical signal transmitters and, more particularly, to motor vehicle electrical signal transmitters provided with a magnetic sensor device.

BACKGROUND ART

Motor vehicle electrical signal transmitters are particularly intended to transmit a signal depending on the current position of a movable part of a motor vehicle, for example, the actuator of an automatic gearbox unit, so that associated devices, such as the automatic gearbox unit, are influenced accordingly.

In German Patent No. DE 41 23 480 A1, an electrical signal transmitter is disclosed which includes a magnetic component and an element. The element is sensitive to magnetic force and is separated from the magnetic component by means of a dividing wall. A signal is transmitted which corresponds to the position of a movable part of a vehicle, such as, for example, the control cam of a vehicle gearbox unit. This signal transmitter, however, does not allow several positions of the movable part lying one behind the other to be recognized.

SUMMARY OF THE INVENTION

Accordingly, an object of the present invention is to provide an electrical signal transmitter provided with a magnetic sensor device so that a wide variety of positions and intermediate stages can be properly recognized.

In carrying out the above object and other objects, an electrical signal transmitter having a sensor device provided on a holder for the detection of a particular position of a movable part is provided. The transmitter includes a magnetic trigger member longitudinally slidable along the holder. The magnetic trigger member is linked to the movable part so that the position of the magnetic trigger member corresponds to the position of the movable part. A plurality of magnetic tracks run longitudinally along the magnetic trigger member. The magnetic tracks have alternating magnetic N/S pole sections running longitudinally along the magnetic trigger member to provide a coding scheme indicative of the position of the magnetic trigger member.

A plurality of magnetic field sensitive components is also provided. At least one magnetic field sensitive component is operatively associated with each of the plurality of magnetic tracks to sense magnetic fields generated from the N/S pole sections of the plurality of magnetic tracks as the magnetic trigger member slides along the holder. The at least one magnetic field sensitive component then generates a signal based on the sensed magnetic fields. The signal is indicative of the position of the magnetic trigger member. A switching arrangement operable with the plurality of magnetic field sensitive components evaluates the signal to influence a device associated with the movable part.

A particular advantage of the electrical signal transmitter is that each change of position is exactly recognized so that is it possible to achieve faultless and extremely fine and sensitive control of, for example, a downstream automatic vehicle gearbox unit.

Further advantageous forms of the object of the invention are described in the dependent claims and explained more closely by means of an embodiment which is shown in the drawings.

BEST MODES FOR CARRYING OUT THE INVENTION

Figure 1A:
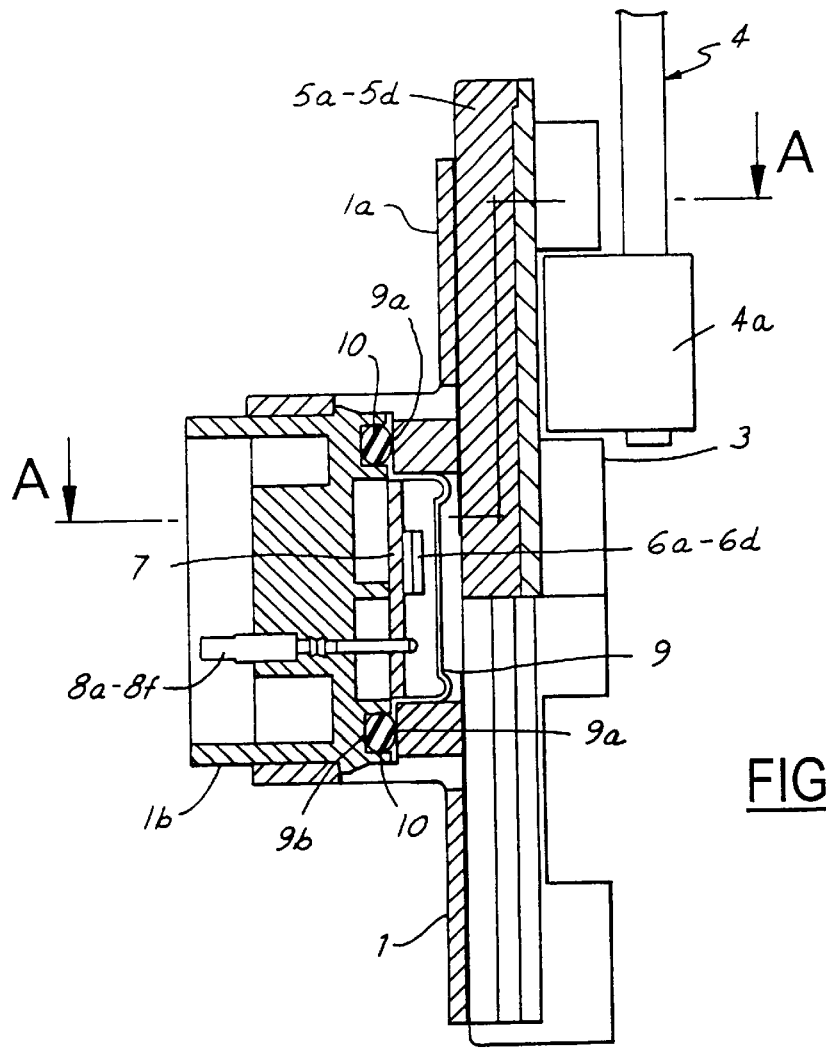
FIG. 1a illustrates an electrical signal transmitter shown in cross-section along line B—B of FIG. 1b.
Figure 1B:
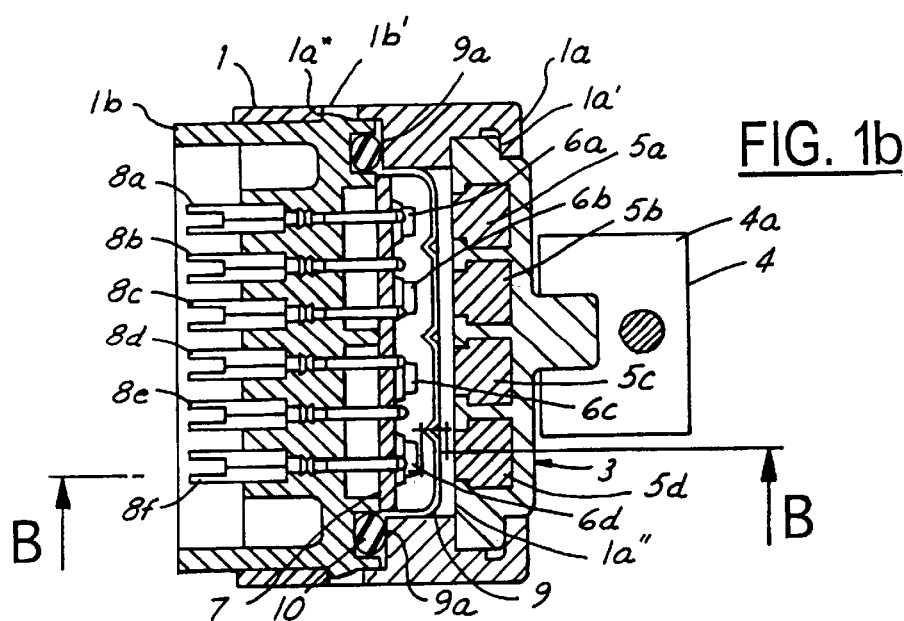
FIG. 1b illustrates the signal transmitter shown in cross-section along line A—A of FIG. 1a (in order to show the design more clearly, the view of the contacts does not correspond to A—A)

As can be seen in FIG. 1, a holder 1 is located in a motor vehicle in a fixed manner, the holder essentially consisting of two housing parts 1a, 1b, manufactured preferably of a plastic material and connected by means of clipping elements 1a*/1b*. A magnetic trigger member 3 in the form of a slider is held on housing part 1a in two guide grooves 1a', 1a" located on same so that it can slide along a longitudinal direction. Trigger member 3 is moved by means of an actuator 4 which may preferably be influenced by manual means. Actuator 4, preferably in the form of the selector level of an automatic gearbox, is linked with trigger member 3 by means of a coupling element 4a so that the position of the trigger member corresponds to the position of the actuator.

Figures 2A, 2B:
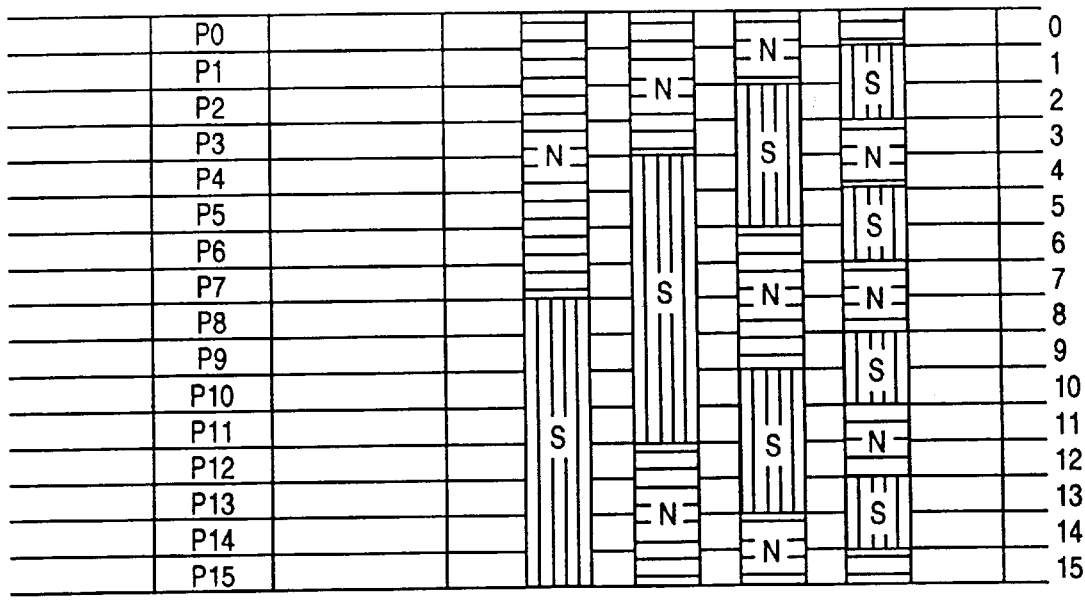
FIG. 2a illustrates the arrangement of the magnetic poles of the four magnetic tracks shown in FIG. 1 for providing a coding scheme.
FIG. 2b is a signal table which results from the arrangement of the magnetic poles.

In or on trigger member 3, a plurality of magnetic tracks 5a–5d, manufactured of permanently magnetic material and of equal length are arranged in a parallel fashion, the tracks running in the sliding direction of trigger member 3. Magnetic tracks 5a–5d consist of magnetic N/S pole sections of differing lengths, whereby in each magnetic track the N/S pole sections alternate with each other as shown, for example, in FIG. 2a, the signals shown in FIG. 2b resulting from this arrangement. By means of these signals, based on a so-called 4-bit coding, predetermined positions or intermediate positions of trigger member 3 and actuator 4 can be clearly recognized. The lengths of the N/S pole sections may be varied to adjust the position measurement sensitivity depending on the particular application.

The signals are generated by means of a plurality of magnetic field sensitive components 6a–6d, which are located on the other housing part 1b and are assigned to magnetic tracks 5a–5d. Components 6a–6d are arranged on a printed circuit board 7 at intervals which correspond to the intervals between the magnetic tracks. Components 6a–6d sense magnetic fields generated from the N/S pole sections of magnetic tracks 5a–5d as trigger member 3 slides along holder 1. Components 6a–6d generate the signals which are indicative of the positions of trigger member 3. Preferably, there are n magnetic tracks and n components such that $2^n$ positions of trigger member 3 can be detected.

Components 6a–6d, which preferably are based on exploitation of the Hall effect, are connected with conductive tracks, not shown here for the sake of simplicity, situated on printed circuit board 7. The conductive tracks are connected with connector contact elements 8a–8f provided on one side of the printed circuit board and arranged perpendicularly to it, extending along a longitudinal direction. The contact elements are also provided on the other side of the printed circuit board with conductors of a switching arrangement, also not shown for the sake of simplicity. The switching arrangement evaluates the signals present at the component outputs. Through this switching arrangement, a device which is assigned to it, such as a vehicle automatic gearbox, can be correspondingly influenced.

In the case that the signal transmitter is assigned to a vehicle automatic gearbox unit, it is advantageous to arrange components 6a–6d in a hermetically sealed housing chamber which is provided on holder 1, and to separate them from magnetic tracks 5a–5d by means of a dividing wall 9 held in a keyed-in manner. Dividing wall 9 preferably consists of a magnetic permeable material or brass. In this way, holder 1 can be placed inside the automatic gearbox unit, whereby the holder is situated in the inner gear chamber, i.e. submerged in oil. For the sealing of the housing chamber, an O-ring 10 of elastomeric material is provided in a circumferential groove 1b' on the other housing part 1b, which on the other side runs around the outside edge 9a of dividing wall 9. In this arrangement, components 6a–6d and trigger member 3 are each situated near dividing wall 9 and the components run essentially in a direction parallel to the dividing wall.

While the best modes for carrying out the invention have been described in detail, those familiar with the art to which this invention relates will recognize various alternative designs and embodiments for practicing the invention as defined by the following claims.

What is claimed is:

1. A magnetic sensor device provided on a holder for the detection of longitudinal position of a selector level of an automatic gearbox of a motor vehicle, the device comprising:

a magnetic trigger member longitudinally slidable along the holder and linked to a selector level of an automatic gearbox of a motor vehicle so that a longitudinal position of the magnetic trigger member corresponds to a longitudinal position of the selector level of the automatic gearbox;

a plurality of parallel equal length magnetic tracks running longitudinally along the magnetic trigger member, each of the magnetic tracks having contiguous alternating magnetic N/S pole sections running longitudinally along the magnetic trigger member, each of the magnetic N/S pole sections having north and south poles, wherein the magnetic N/S pole sections in each track are arranged such that the north pole of each of the magnetic N/S pole sections is adjacent to the south pole of an adjacent magnetic N/S pole section, wherein the magnetic N/S pole sections of each magnetic track have the same length and the length of the magnetic N/S pole sections of each magnetic track is different than the lengths of the magnetic N/S pole sections of the other magnetic tracks to provide a binary coding scheme indicative of the longitudinal position of the magnetic trigger member and the selector level of the automatic gearbox;

a plurality of magnetic field sensitive components each operatively associated with a respective one of the magnetic tracks to sense magnetic fields generated from the magnetic N/S pole sections as the magnetic trigger member slides along the holder, wherein the magnetic field sensitive components generate a signal based on the sensed magnetic fields indicative of the longitudinal position of the magnetic trigger member and the selector level of the automatic gearbox, wherein the plurality of magnetic field sensitive components exploit the Hall effect for sensing the magnetic fields generated as the magnetic trigger member slides alone the holder, wherein n magnetic tracks and n magnetic field sensitive components are provided to detect $2^n$ longitudinal positions of the selector level of the automatic gearbox; and a switching arrangement operable with the magnetic field sensitive components for evaluating the signal to influence a motor vehicle device associated with the selector level of the automatic gearbox as a function of the longitudinal position of the selector level of the automatic gearbox.

2. The device of claim 1 wherein:

the magnetic field sensitive components are arranged in a hermetically sealed housing chamber of the holder.

3. The device of claim 2 wherein:

the magnetic field sensitive components and the magnetic tracks are hermetically separated from one another by a dividing wall of the housing chamber, wherein the magnetic field sensitive components and the magnetic trigger member are each situated near the dividing wall.

4. The device of claim 1 wherein:

the holder consists of two housing parts between which a dividing wall is held.

5. The device of claim 4 further comprising:

an elastomeric sealing means assigned to the dividing wall.

6. The device of claim 5 wherein:

the sealing means is an O-ring located in a circumferential groove belonging to the other of the two housing parts.

7. The device of claim 6 wherein:

the magnetic field sensitive components are connected to the switching arrangement by electrical conductors present on the holder.

8. The device of claim 7 wherein:

the magnetic field sensitive components are held on a surface of a printed circuit board which runs essentially in a direction parallel to the dividing wall and are electrically connected with conductive tracks provided on said board which are connected to the electrical conductors.

* * * * *